US 7,352,621 B2

(12) United States Patent
Rothman et al.

(10) Patent No.: US 7,352,621 B2
(45) Date of Patent: Apr. 1, 2008

(54) METHOD FOR ENHANCED BLOCK MANAGEMENT

(75) Inventors: Michael A. Rothman, Puyallup, WA (US); Vincent J. Zimmer, Federal Way, WA (US)

(73) Assignee: Intel Corporation, Santa Clara, CA (US)

(*) Notice: Subject to any disclaimer, the term of this patent is extended or adjusted under 35 U.S.C. 154(b) by 37 days.

(21) Appl. No.: 11/166,842

(22) Filed: Jun. 23, 2005

(65) Prior Publication Data
US 2006/0291304 A1 Dec. 28, 2006

(51) Int. Cl.
*G11C 16/06* (2006.01)
*G11C 16/04* (2006.01)
*G11C 7/00* (2006.01)
*G11C 8/00* (2006.01)
*G06F 11/00* (2006.01)
*G06F 12/00* (2006.01)
*G06F 13/00* (2006.01)

(52) U.S. Cl. .................... 365/185.09; 365/185.11; 365/200; 365/230.03; 711/200; 714/1

(58) Field of Classification Search ......... 365/185.09, 365/200; 711/200, 201, 202, 204, 205, 206, 711/213
See application file for complete search history.

(56) References Cited

U.S. PATENT DOCUMENTS

| 6,715,106 | B1* | 3/2004 | Mermelstein | 714/36 |
|---|---|---|---|---|
| 2003/0225961 | A1* | 12/2003 | Chow et al. | 711/103 |
| 2004/0003315 | A1* | 1/2004 | Lakhani et al. | 714/8 |
| 2004/0015674 | A1* | 1/2004 | Lakhani et al. | 711/206 |
| 2004/0177230 | A1* | 9/2004 | Freiwald et al. | 711/212 |
| 2005/0008162 | A1* | 1/2005 | Brokenshire et al. | 380/277 |
| 2005/0144405 | A1 | 6/2005 | Doran et al. | |
| 2005/0188278 | A1 | 8/2005 | Zimmer et al. | |
| 2005/0286644 | A1 | 12/2005 | Jaussi et al. | |
| 2006/0010314 | A1* | 1/2006 | Xu | 713/2 |
| 2006/0026319 | A1 | 2/2006 | Rothman et al. | |

* cited by examiner

*Primary Examiner*—Lý Duy Pham
(74) *Attorney, Agent, or Firm*—David P. McAbee

(57) ABSTRACT

A method and apparatus is described herein for managing bad blocks/sectors in a nonvolatile memory. Upon detecting an input/output fault to a target block in a nonvolatile memory, the target block is remapped to a spare block, if the block is predicted as a bad block. Remapping is done for blocks used to store code both in serial execution code sequences and code sequences utilizing address translation. The remapping of bad blocks/sectors in nonvolatile memory allows nonvolatile memory in computer systems to be robust and resilient in handling bad blocks.

16 Claims, 6 Drawing Sheets

METHOD FOR ENHANCED BLOCK MANAGEMENT

FIELD

This invention relates to the field of computer systems, and in particular, to managing blocks of nonvolatile memory.

BACKGROUND

As computers advance, integration of platforms and their components become a larger and more complex task. Designers of computer systems prefer platforms to be modular and upgradeable, so pieces of the platform may be updated without having to replace the whole system. In light of this industry model, basic input/output software (BIOS) used to initially boot a platform is typically stored on a FLASH device. Therefore, if a platform's configuration needs to be changed and the BIOS needs to be updated, a memory device is erased and updated with new code/software.

Previously, memory devices were not erased regularly, as it was not necessary to update the BIOS frequently. However, new usage models of a platform's BIOS has changed the frequency in which the BIOS is erased. Examples of the new usage models include, expanding the use of the BIOS into the operating system (OS) space and using the FLASH as a repository for configuration related data.

Although today's FLASH devices have the ability to be rewritten with a good level of reliability, FLASH devices are still susceptible to write-failure limitations. Moreover, the increase in the regularity that FLASH devices are updated exposes an inherent fragility that was not exhibited previously due to the static nature of a FLASH device's usage.

Upon manufacture and frequent flashing, a FLASH device may develop bad blocks, i.e. blocks that result in a read or write failure upon access. Bad blocks may cause failure in initialization of the platform or other configuration problems. Currently, bad blocks in a FLASH potentially cause the whole FLASH device to be scrapped and replaced, which is inefficient and expensive.

BRIEF DESCRIPTION OF THE DRAWINGS

The present invention is illustrated by way of example and not intended to be limited by the figures of the accompanying drawings.

FIG. 4b illustrates a more specific embodiment of the flow diagram shown in FIG. 4a.

DETAILED DESCRIPTION

In the following description, numerous specific details are set forth such as specific types of memory, specific remapping techniques, and specific types of serial execution and address translation in order to provide a thorough understanding of the present invention. It will be apparent, however, to one skilled in the art that these specific details need not be employed to practice the present invention. In other instances, well known components or methods, such as well-known flash design and specific architectures/instructions, etc., have not been described in detail in order to avoid unnecessarily obscuring the present invention.

Figure 1:
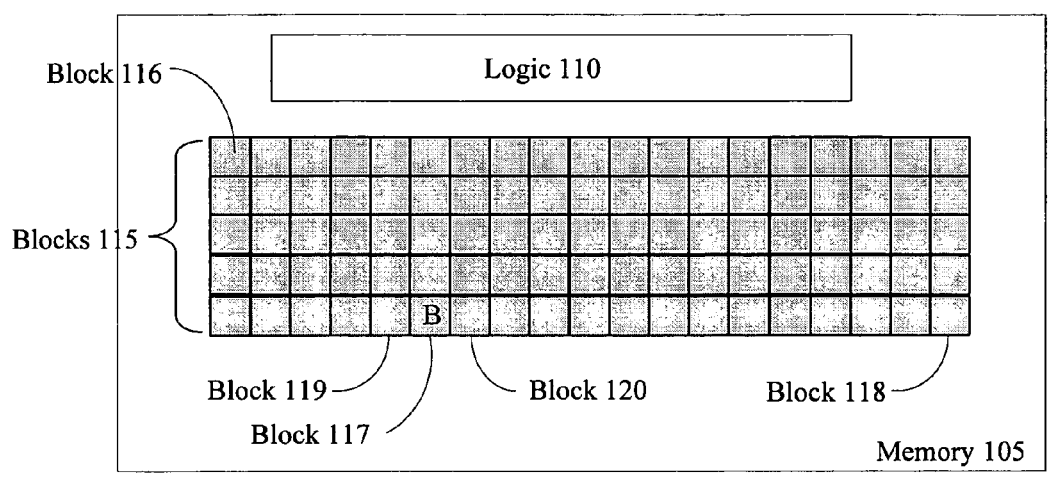
FIG. 1 illustrates an embodiment a nonvolatile memory having a bad block.

Referring to FIG. 1, an embodiment of a memory 105 is illustrated. Memory 105 includes a plurality of blocks, such as blocks 115, and specifically, individual blocks 116, 117, 118, 119, and 120. A block includes a granular grouping of memory. Therefore, a block is any amount of memory grouped together including, a number of bits, bytes, KB, or MB. For example, memory 105 is grouped into 8 Kbyte blocks, such that, block 116-120 each have a size of 8 Kbytes. As another example, memory 105 is grouped into blocks having a size of 128 Kbytes.

Often, when memory 105 is a FLASH memory, operations, such as erasing parts of memory, occur in blocks, instead of on a bit by bit basis. Consequently, erasing may include converting all the bits in a block to a logical voltage level of a "1", or inversely to a logical voltage level of a "0", instead of just operating on a single bit. Because of this block level operation, in a FLASH device, a block is commonly referred to as the operational granularity of the FLASH, at least with respect to erasing information in a FLASH. Continuing the second example from above, where a block has a size of 128 Kbytes, when wanting to erase a section of a block, all 128 Kbytes are erased. In this instance the whole 128 Kbyte block is erased and reset to a default logical level.

One example of memory 105, as stated above, includes a FLASH memory. However, memory 105 is any memory that is logically viewed or physically organized in blocks. Memory 105 may also, but is not required to be, any memory that retains stored information after power is removed, lost, or turned off. Other examples of memory 105 include a nonvolatile memory, an erasable programmable read only memory (EPROM), an electrically erasable programmable read only memory (EEPROM), a programmable logic array (PLA), and a random access memory (RAM) with a battery backup.

Figure 2A:
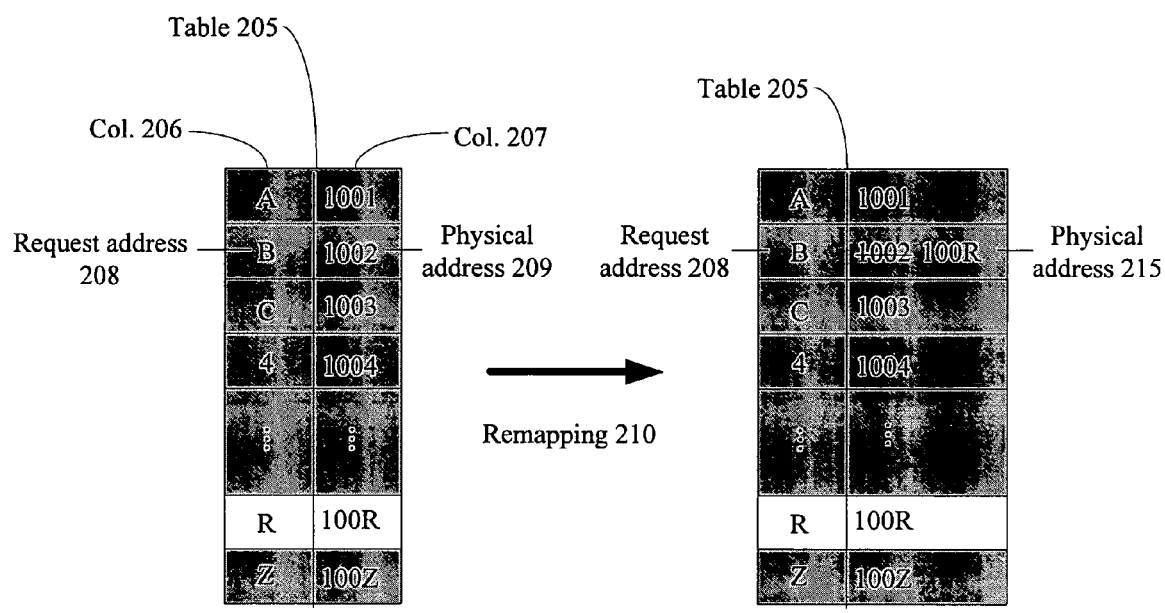
FIG. 2a illustrates an embodiment of remapping a bad block in an execution environment utilizing address translation.

Memory 105 may store any code, data, operands, or other information commonly stored in a memory device. As a specific example, memory 105 is a FLASH device used to store basic input/output software (BIOS). A FLASH device, as used today to store a BIOS, also stores a repository of configuration data, boot routines, and other code/data for initializing and running a platform/operating system. In one instance, memory 105 stores code/data in an execute in place (XiP) architecture. In an XiP architecture, blocks are directly mapped and operated out of a processor's cache. Often, in an XiP architecture, since memory locations are directly mapped, no lookup or address translation is used. Rather, the processor executes directly from the physical address locations within memory. XiP and non-XiP architectures will be discussed in more detail in reference to FIGS. 2a-2c below.

As mentioned above, memory devices, such as memory 105, may have bad blocks, such as block 117, upon manufacture, as well as develop bad blocks due to usage. Commonly, a bad block refers to a block of memory that results in a fault upon access. Typically a bad block is associated with a block that is not accessible or has corrupted data due to a hardware failure or physical problem with memory 105. Examples of faults or failures include an input/output fault (i.e. read or write fault/failure), a failed access, an error during access, a parity failure, an incorrect storage of information, or any other common failure associated with memory accesses due to a failure of memory 105.

However, a "bad block" is also open to definition by platform policy. In one example, a predicted bad block includes any block of memory that fails once during an access, i.e. a read or write operation. Also, if a block becomes unreliable, such as incorrectly storing or providing the contents of the block, then the block may be predictively determined to be a bad block. This predictive failure analysis, such as determining a block is a bad block upon first failure, allows preemptive marking of bad blocks/segments prior to their actual complete failure, which enables the migration of good data in physically bad blocks to physically good and reliable blocks.

Alternatively, a bad block may defined by a certain predefined number of failures, i.e. N failures, such as three. Consequently, accesses to a block would have to fail three times before determining that block was a "bad block." As three failures was an illustrative example, the number of failures before a block is considered a bad block may be any positive integer. In another example, a certain number of consecutive failures occur before determining that a block is a bad block. So, assuming three consecutive failures is defined by platform policy and accesses to a block failed only twice, the block would not be considered a bad block until the third consecutive failure.

Logic 110 is also illustrated within memory 105 in FIG. 1. Placement of logic 110 is not so limited, as logic 110 may be software, hardware, firmware, or any combination thereof. In one embodiment, logic 110 is firmware used to interface with memory 105. Logic 110 remaps a target block, such as target block 117, if the target block is identified as a bad block. As an example, if accessing target block 117 results in N failures, as discussed above, then target block 117 is remapped. N is any positive integer, such as 1, 2, 3, etc. In one embodiment, remapping of block 117 includes accessing a spare/replacement block upon requesting access to target block 117. In another embodiment, remapping includes ignoring target block 117 in an execution path and jumping to a next/subsequent block for execution Turning to FIG. 2a, remapping of a target block in an architecture utilizing address translation is illustrated. Address table 205 is shown on the left, before remapping of target block 117. In this illustration, a processing element, such as a microprocessor, requests access to a block, either for reading or writing, with a request address. Requesting addresses are illustrated in column 206 and correspond to a physical address in column 207. Each physical address in column 207 references a physical location in memory 105.

As an example, a microprocessor requests access to target block 117 by referencing request address 208, which is shown for illustrative purposes as B. In address translation table 205, request address B is looked up and translated to physical address 209, which is shown as 1002. Physical address 1002 within the memory, which references target block 117, is then accessed. Note that this is a simplified example of address translation using lookup tables. Well-known address translation based of addresses and bits within requests using single and multiple address tables, offsets, and other address translation techniques may be used. One specific example of address translation used commonly in microprocessor systems is virtual to physical address translation using linear address translation.

In remapping flow 210, address translation table 205 is updated to remap target block 117 to a replacement/spare block, such as spare block 118 shown in FIG. 1. As illustrated, to remap target block 117 to another spare block in memory 105, the requesting address B is associated with physical address 100R, which references the physical address of spare/replacement block 118. Restating the example above, when target block 117 is identified as a bad block, target block 117 is remapped by associating requesting address 208 with replacement block 118, having physical address 215, in lookup table 205, which is used to translate requested addresses to physical address locations. Consequently, when a processing element subsequently includes a reference to requesting address B, from table 205, requesting address B is translated to remapped physical address 100R. This remapping results in the access of spare block 118 instead of target block 117.

Other methods of translating requests to physical spare/replacement blocks may be used. For example, common file-system constructs in firmware are used to translate incoming requests into accesses of spare blocks. As another example, a bad block database is kept, where bad blocks are recorded and remapped to spare blocks by translation of requests into physical addresses of replacement blocks.

Figure 2B:
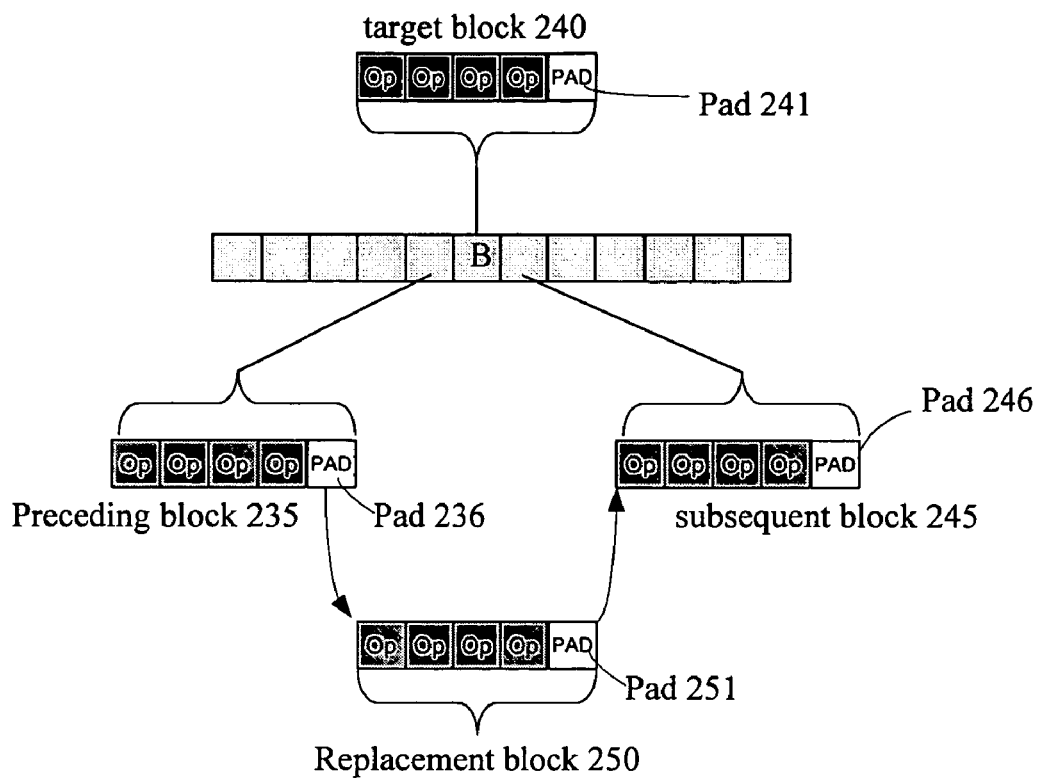
FIG. 2b illustrates an embodiment of remapping a bad block in a serial execution environment.

Turning to FIG. 2b, remapping of a target block, such as block 240, in a serial execution architecture is shown. As mentioned above, an execute in place (XiP) architecture often does not use address translation or look up tables to execute from memory. In fact, many times in serial execution the processor will blindly execute block to block. For example, a processor will execute preceding block 235, target block 240, and then subsequent block 245 in order. Previously, if a bad block was encountered, execution would potentially hang without chance of recovery, as there is no way to redirect the processor's execution path.

However, by inserting pad fields/bits, such as pad fields 236, 241, 246, and 251, at the end of each block, it is possible remap the path of execution, i.e. remap execution intended for block 240 to a spare or replacement block 250. In normal operation, the pad bits are ignored or include a command to simply move onto the next opcode or block. However, when remapping target block 240 to replacement block 250, bits are changed or commands are inserted into the pad fields. For example, if target block 240 is predicted as a bad block, then remapping target block 240 to replacement block 250 includes pointing pad field 236 to replacement block 250 and pointing pad field 251 of replacement block 250 to subsequent block 245.

In one embodiment, pad fields point to other blocks using jump commands to be executed by a processor. Consequently, upon serial execution, a processor executes the operations in block 235 and upon executing the instruction in pad field 236, jumps to replacement block 250, instead of executing target block 240. The processor then executes the operations in replacement block 250, which may be code/data migrated from block 240 or newly stored code/data. Upon execution of the jump command in pad field 251, execution jumps back to execute code in subsequent block 245. In this embodiment, logic, such as logic 110 shown in FIG. 1, remaps target block 240 to spare block 250 by inserting the jump command in pad field 236 to point to replacement block 250 and the jump command in pad field 251 to point to subsequent block 245.

In this example, preceding block 235 is shown contiguous and immediately preceding or prior to target block 240 and subsequent block 245 is illustrated contiguous and immediately after or succeeding target block 240. However, prior and subsequent blocks are not required to be physically located before or after target block 240. For example, preceding block 235 and subsequent block 245 are physically located anywhere in memory, while preceding block precedes target block 240 and subsequent block succeeds target block 240 only in an execution path.

Figure 2C:
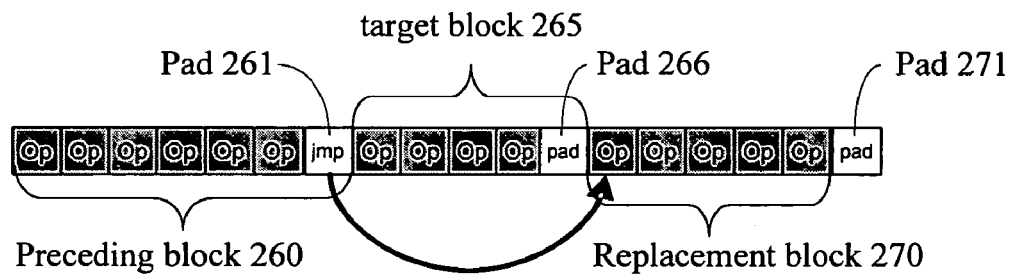
FIG. 2c illustrates another embodiment of remapping a bad block in a serial execution environment.

Referring to FIG. 2c another embodiment of remapping a target block to a replacement block is illustrated. In this embodiment, another serial execution architecture is shown, such as an XiP architecture. Here, remapping includes jumping around target block 265 to replacement block 270, instead of changing the path of execution to a spare block, as discussed above. Much like the previous example, preceding block 260, target block 265, and replacement block 270 all have pad fields, such as pad fields 261, 266, and 271, respectively. In this case, a jump command is inserted into pad field 261 to point to replacement block 270 to remap target block 265 to replacement block 270. The remapping discussed in this embodiment is potentially useful in a situation where FLASH during manufacture developed bad blocks. Therefore, a target block, such as target block 265, is ignored and storage/execution happens seamlessly between preceding block 260 and replacement block 270.

Figure 3:
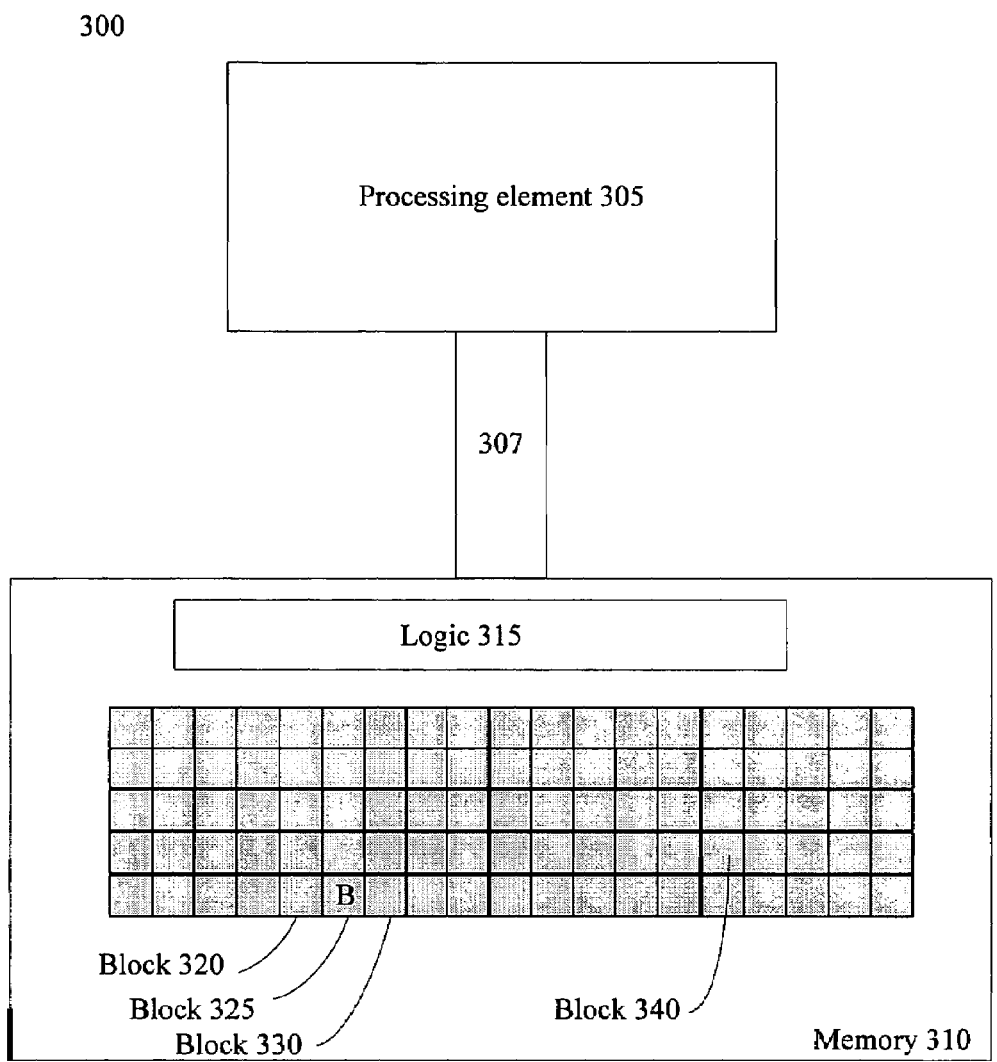
FIG. 3 illustrates an embodiment of a processing element coupled to a memory, the memory using enhanced block management to manage bad blocks.

In FIG. 3 a system employing enhanced block management to remap bad blocks is illustrated. Processing element 305 is illustrated coupled to memory 310 through interconnect 307. Examples of processing element 305 include an embedded controller, a microcontroller, a controller hub, a microprocessor, a co-processor, a digital signal processor, a processing cell, a processor core, and an out-of-order microprocessor capable of executing multiple threads in parallel. Interconnect 307 is shown coupling memory 310 to processing element 305, however, any other component, such as a controller hub, memory, or another processing element may be coupled between processing element 305 and memory 310.

In one embodiment, system 300 uses a direct mapped memory space, where processing element 305 executes linearly through at least a portion of memory 310 to boot. As an example, system 310 is an XiP architecture, where at least a portion of memory 310 serially stores boot routines to boot computer system 300. Processing element 305 executes each block blindly and in order. Therefore, before any remapping, processing element 305 executes block 320, block 325, and then block 330 in order. As stated above, logic 315 remaps target block 325 to spare block 340, if target block 325 is identified as a bad block, i.e. results in N I/O faults. For example, logic 315, which in this example is firmware, inserts a jump command in the pad field of preceding block 320 to point the path of execution to spare block 340 and a jump command in the pad field of spare block 340 to return the path of execution to subsequent block 330.

In an alternate embodiment, system 300 utilizes address translation to access blocks within memory 310. Boot routines and other information are stored at any location in any order within memory 310. Processing element 305 references a request or virtual address, which is translated to a physical address referencing a block within memory 310. As a result, remapping of target block 325 to spare block 340 is done by associating the requesting address, that is currently associated with the physical address referencing target block 325, with the physical address referencing spare block 340. After remapping, when processing element 305 includes the requesting address previously associated with target block 325, during address translation the physical address referencing spare block 340 is now accessed instead.

Figure 4A:
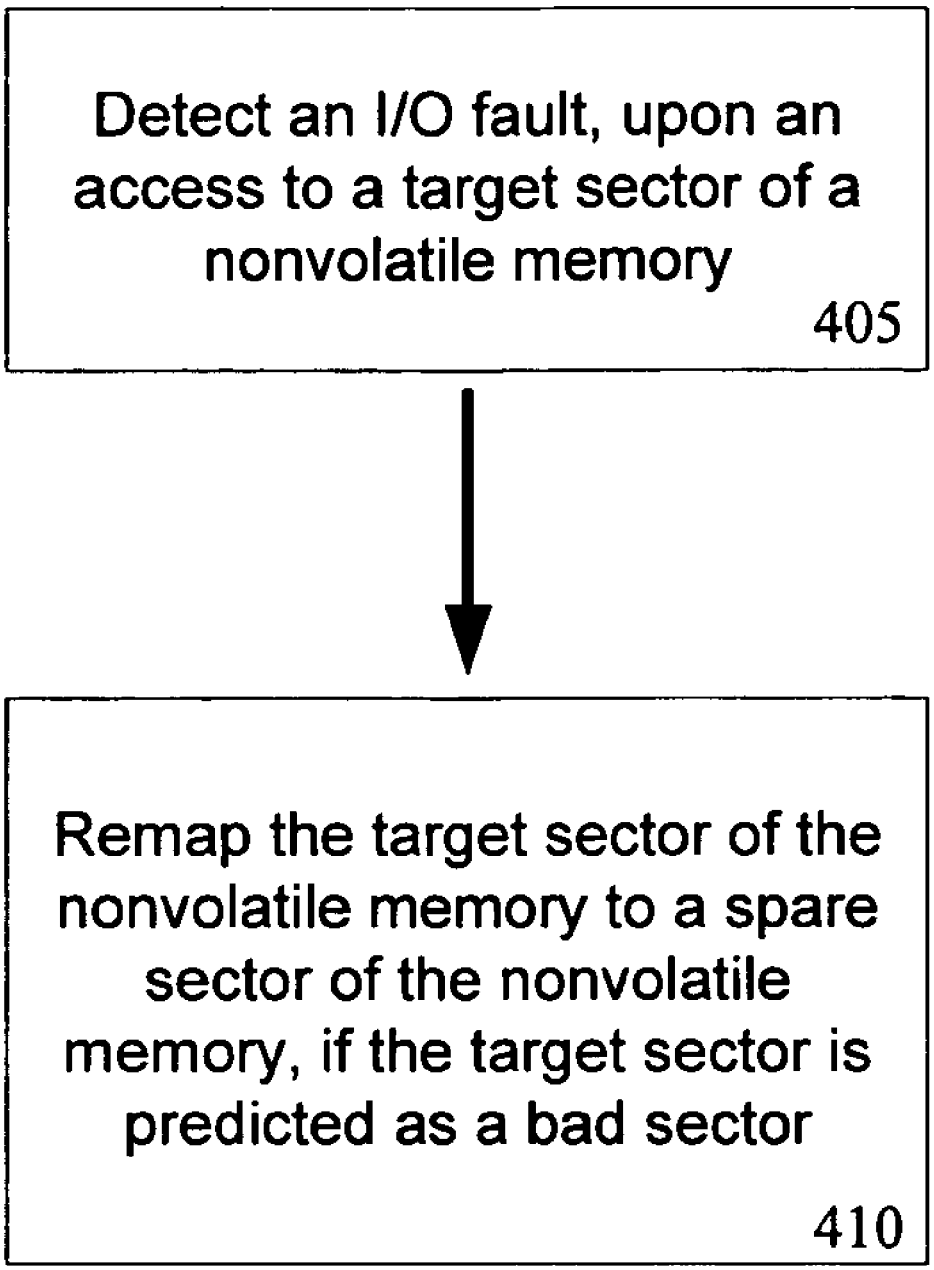
FIG. 4a illustrates an embodiment of a flow diagram for managing bad blocks in a nonvolatile memory.

Turning to FIG. 4a, an embodiment for a method of managing bad blocks/sectors in a memory is illustrated. In block 405 an I/O fault is detected, upon an access to a target sector of a nonvolatile memory. An access to a target sector of a nonvolatile memory, as stated above, may be any read, write, erase, or other operation manipulating or requesting access to the target block. Moreover, an I/O fault is any unsuccessful attempt at an aforementioned operation/access. Examples of I/O faults include an error during a write attempt, an error during a read attempt, incorrect parity of contents of the target block, or an inability to make a physical access to the target block. Detecting the I/O fault includes any failure in a read, write, or other access operation to a block of memory. For example, if a processor writes to a block of memory, but the write operation is not completed, the block is inaccessible, the wrong data is written to the block, or another failure occurs, then an I/O fault is detected/registered.

After detecting an I/O fault to a target sector, based on platform policy the target sector is predicted as a bad sector. To ensure data/code already stored in the sector is still accessible and moveable to a new location, such as a spare block, platform policy may preemptively determine the sector is unreliable, i.e. a bad sector. As an example, upon detecting a first I/O fault to a target sector, the target sector is predicted as a bad sector. Potentially, a first failure to a sector does not mean that the sector is physically defective. However, for the utmost reliability, when that first I/O fault is detected, the target sector is remapped before the sector becomes completely unreliable and unreadable. In block 410, the target sector of the nonvolatile memory is remapped to a spare sector of the nonvolatile memory, if the target sector is predicted as a bad sector. In the alternative, any number N of failures or consecutive failures may be required before predicting a sector as a "bad sector."

Figure 4B:
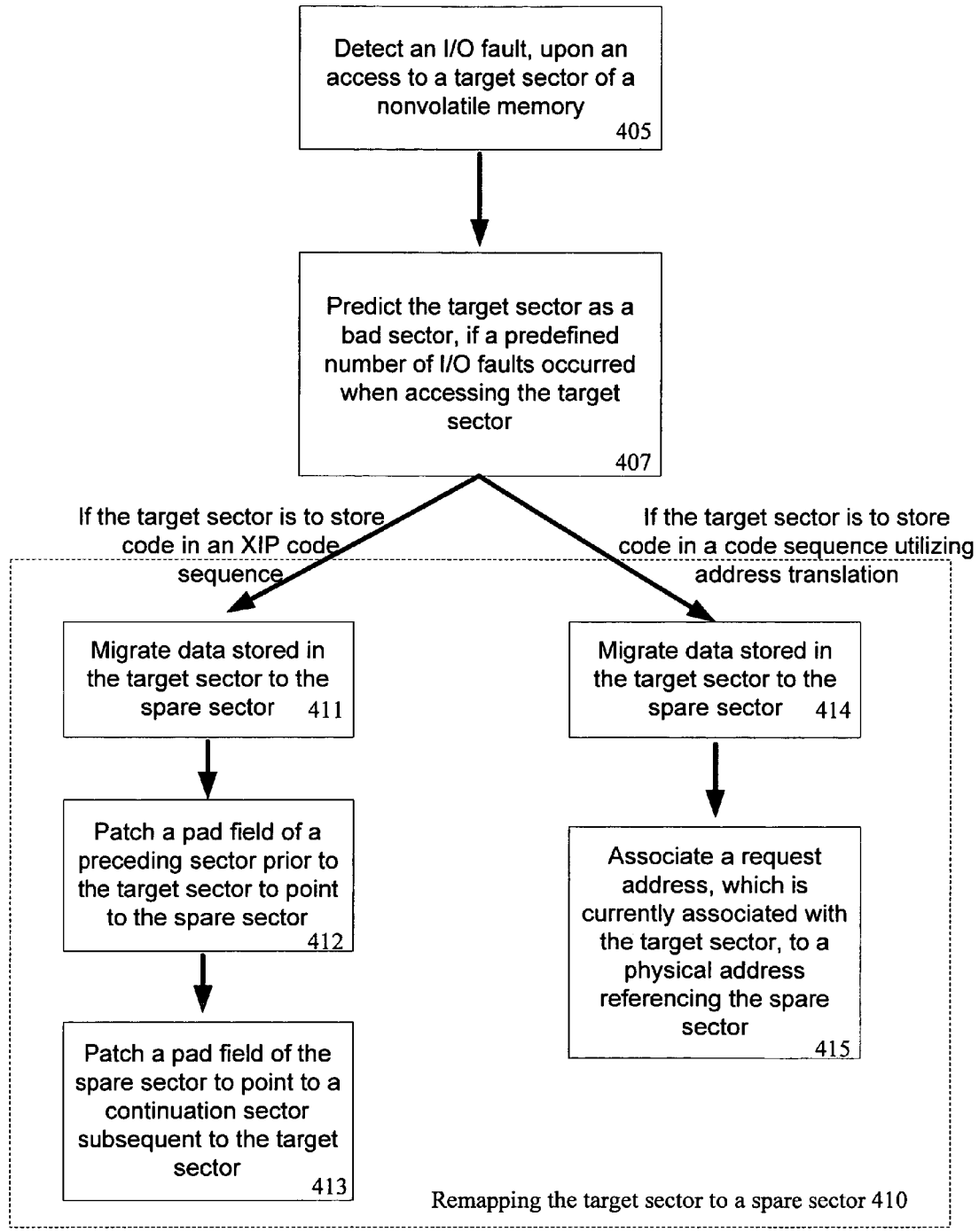

Referring to FIG. 4b, a more specific embodiment of remapping of a target sector to a spare sector is illustrated. In the discussion above, remapping of a block or sector was discussed in exclusive reference to either a serial execution architecture or an address translation architecture. However, it is not uncommon for a memory, such as memory 105 illustrated in FIG. 1, to store information for both a serial execution code sequence and information to be executed using address translation. For example, a FLASH device stores boot routines in a serial fashion to boot a system and stores static data, such as system IDs or configuration data, in sectors/blocks that are accessed by firmware through address translation.

As a result, after predicting a target sector is a bad sector, if a predefined number of I/O faults occurred when accessing the target sector in block 407, it is determined whether the target sector is storing code in a serial/XiP code sequence or a code sequence utilizing address translation.

If the target sector is to store code in an XIP code sequence and there is valid data/code currently stored in the target sector, that data/code is migrated to a spare sector in block 411. A pad field present in a sector prior to the target sector is patched to point to the spare sector in block 412. Then, in block 413, a pad field in the spare sector is patched to point to a continuation sector subsequent to the target sector. As an illustrative example, a failure occurs in reading a target block. The failure is the first failure to the target block, but platform policy dictates that a upon a first failure the block is marked/predicted as a bad block. The block contains a boot routine for initializing a network device to be executed in a serial XiP architecture. Consequently, the boot routine is copied from the target sector, if possible, and migrated to a spare block. Firmware inserts a jump command in a block immediately preceding the target block to point to the spare block and a jump command in the spare block to point to a block immediately succeeding the target block. Upon booting the system, after the remapping described immediately above, the preceding block is executed. After executing the jump command in the preceding block, the boot routine to initialize the network card is executed from the spare block. At the end of the spare block, the jump command is executed to return the execution path to the subsequent block.

Alternatively, if the target block stores code/data in a code sequence using address translation, then the data, if possible, is migrated to a spare block in block 414. Then, in block 415, a request address, which is currently associated with the target sector, is associated with a physical address referencing the spare block. As above, this association may be done in a lookup table, a plurality of address translation tables, an address offset hierarchy, or other address translation technique.

As can be seen from above, unreliable blocks or sectors of a nonvolatile memory are remapped to alleviate the potential impact of developing bad sectors/blocks. Currently, the nonvolatile memory would have to be switched out or a whole circuit board replaced. This remapping is done in either a serial or non-serial execution architecture. In a serial architecture, pad bits or pad fields are included in each block. The pad fields are manipulated to point the path of execution to other blocks, which enables the remapping of an unreliable block to a valid spare block. Furthermore, by allowing platform policy to predict when a block is bad, different levels of reliability may be implemented. Consequently, as the upgrading and flashing of nonvolatile memory becomes more frequent, the ability of the nonvolatile memory to adapt to bad sectors creates a resilient system that does not require constant replacement of nonvolatile memory.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An apparatus comprising:
    a nonvolatile memory erasable in blocks including,
        a preceding block to store code;
        a target block to store code; and
        a replacement block to store code; and
    logic to insert preceding pad bits in the preceding block to remap the target block to the replacement block, in response to the target block being identified as a bad block,
    wherein the target block is identified as a bad block if accessing the target block results in N I/O faults, N being any positive integer.

2. The apparatus of claim 1, wherein the nonvolatile memory is a FLASH device to store basic input/output software (BIOS) code.

3. The apparatus of claim 1, wherein the preceding pad bits represent a jump command to jump around the target block to the replacement block.

4. The apparatus of claim 1, wherein the preceding pad bits represent a reference to the replacement block.

5. The apparatus of claim 4, wherein the nonvolatile memory further includes a subsequent block, wherein the logic is also to insert replacement pad bits in the replacement block, the replacement pad bits to represent a reference to the subsequent block.

6. The apparatus of claim 5, wherein the logic comprises firmware to insert the preceding pad bits in a pad field of the preceding block and the replacement pad bits in a pad field of the replacement block, and wherein the reference to the replacement block includes a jump command to the replacement block and the reference to the subsequent block includes a jump command to the subsequent block.

7. The apparatus of claim 5, wherein the preceding block precedes and is contiguous with the target block, and wherein the subsequent block succeeds and is contiguous with the target block.

8. The apparatus of claim 6, wherein the nonvolatile memory is to store code serially in the plurality of blocks for execution in an execute in place (XiP) architecture.

9. A system comprising:
    a flash memory including,
        a predicted bad block of a plurality of blocks, and
        logic to insert a first reference to a replacement block in a first pad field of a preceding block, which precedes the predicted bad block, and insert a second reference to a subsequent block, which succeeds the predicted bad block, in a second pad field of the replacement block; and
    a processing element to execute code stored in the replacement block instead of the predicted bad block in response to the first reference to the replacement block in the first pad field of the preceding block.

10. The system of claim 9, wherein the predicted bad block is to be determined as a predicted bad block in response to an a failed access to the predicted bad block by the processing element.

11. The system of claim 9, wherein the processing element is selected from a group consisting of an embedded controller, a microcontroller, a controller hub, a microprocessor, a co-processor, a digital signal processor, a processing cell, and an an out-of-order microprocessor capable of executing multiple threads in parallel.

12. The system of claim 9, wherein the processing element executes the plurality of blocks in the flash memory in-place.

13. A method comprising:
    detecting an I/O fault, upon an access to a target sector of a nonvolatile memory;
    determining if the target sector is predicted as a bad sector; and
    inserting a jump instruction in a pad field of a first sector immediately preceding the target sector to jump execution over the target sector to a replacement sector, which immediately follows the target sector, in response to determining the target sector is predicted as a bad sector,
    wherein the target sector is determined to be predicted as a bad sector in response to a predefined number of I/O faults to the target sector.

14. A method comprising,
    detecting a bad sector of a nonvolatile memory, the nonvolatile memory including a preceding sector prior to the bad sector, a continuation sector subsequent to the bad sector, and a spare sector, wherein the preceding sector, the bad sector, and the continuation sector are to store code in an execute in place (XiP) code sequence; and
    in response to detecting the bad sector migrating data stored in the bad sector to spare sector;

patching a pad field of the preceding sector to point to the spare sector; and patching a pad field of the spare sector to point to the continuation sector.

15. The method of claim 13, wherein patching a pad field of the preceding sector to point to the spare sector comprises inserting a first jump instruction in the pad field of the preceding sector to jump execution from the preceding sector to the spare sector, and wherein patching a pad field of the spare sector to point to the continuation sector comprises inserting a second jump instruction in the pad field of the spare sector to jump execution from the spare sector to the continuation sector.

16. The method of claim 14, wherein the nonvolatile memory is a memory device selected from a group consisting of a flash device, an erasable programmable read only memory (EPROM), an electrically erasable programmable read only memory (EEPROM), a programmable logic array (PLA), and a random access memory (RAM) with a battery backup.

* * * * *